(12) United States Patent
Fujii

(10) Patent No.: US 10,546,961 B2
(45) Date of Patent: Jan. 28, 2020

(54) SEMICONDUCTOR DEVICE WITH NON-OVERLAPPING IMPURITY LAYERS

(71) Applicant: Mitsubishi Electric Corporation, Tokyo (JP)

(72) Inventor: Hidenori Fujii, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 15/568,489

(22) PCT Filed: Sep. 25, 2015

(86) PCT No.: PCT/JP2015/077018
§ 371 (c)(1),
(2) Date: Oct. 23, 2017

(87) PCT Pub. No.: WO2017/051464
PCT Pub. Date: Mar. 30, 2017

(65) Prior Publication Data
US 2018/0158963 A1 Jun. 7, 2018

(51) Int. Cl.
*H01L 29/86* (2006.01)
*H01L 29/868* (2006.01)
(Continued)

(52) U.S. Cl.
CPC ........ *H01L 29/868* (2013.01); *H01L 29/0619* (2013.01); *H01L 29/6609* (2013.01)

(58) Field of Classification Search
CPC ............... H01L 29/868; H01L 29/0619; H01L 29/0834
See application file for complete search history.

(56) References Cited

U.S. PATENT DOCUMENTS 5,682,044 A * 10/1997 Tamamushi ........ H01L 29/7416
257/147
7,800,204 B2 9/2010 Fujii
(Continued)

FOREIGN PATENT DOCUMENTS

| JP | 01-091475 A | 4/1989 |
| JP | 06-029558 A | 2/1994 |
| JP | 5309360 B2 | 7/2013 |

OTHER PUBLICATIONS

International Search Report issued in PCT/JP2015/077018; dated Dec. 22, 2015.

Primary Examiner — Nduka E Ojeh
Assistant Examiner — Laura M Dykes
(74) Attorney, Agent, or Firm — Studebaker & Brackett PC

(57) ABSTRACT

The technique disclosed in the Description adjusts a modulation level to enable prevention of partial concentration of carriers in a recovery operation. A semiconductor device includes: a semiconductor layer of a first conductivity type; a first impurity layer of the first conductivity type, the first impurity layer being partially diffused in an underside of the semiconductor layer and higher in impurity concentration than the semiconductor layer; and a plurality of second impurity layers of a second conductivity type, the second impurity layers being partially diffused in a surface of the semiconductor layer, wherein the first impurity layer is formed, in a plan view, between the second impurity layers and in a position that does not overlap the second impurity layers, and only the semiconductor layer exists between the second impurity layers in the surface of the semiconductor layer.

13 Claims, 5 Drawing Sheets

(51) Int. Cl.
*H01L 29/06* (2006.01)
*H01L 29/66* (2006.01)

(56) References Cited

U.S. PATENT DOCUMENTS

| | | | |
|---|---|---|---|
| 2011/0175106 A1* | 7/2011 | Mizukami | H01L 29/0692 257/77 |
| 2012/0132954 A1* | 5/2012 | Kouno | H01L 29/0619 257/140 |
| 2014/0167072 A1* | 6/2014 | Chun | H01L 29/872 257/77 |
| 2015/0236104 A1* | 8/2015 | Ogura | H01L 29/36 257/655 |
| 2016/0027867 A1* | 1/2016 | Matsushita | H01L 29/7395 257/140 |

* cited by examiner

SEMICONDUCTOR DEVICE WITH NON-OVERLAPPING IMPURITY LAYERS

TECHNICAL FIELD

The technique disclosed in this Description relates to a semiconductor device, and particularly to a PIN diode used in a power semiconductor device.

BACKGROUND ART

Conventional PIN diodes include an $n^+$ type layer that is a cathode layer, an $n^-$ type layer formed on the $n^+$ type layer, a $p^-$ layer that is partially formed in a surface layer of the $n^-$ type layer and is an anode layer, and p type layers formed in the surface layer of then $n^-$ type layer to be spaced apart from each other and formed to enclose the $p^-$ layer in a plan view.

With such a structure, the $p^-$ layer and the $n^+$ type layer can increase a modulation level and achieve low ON-resistance (low Vf). To adjust the modulation level, a structure for maintaining almost constant, in a depth direction, an impurity concentration of the $p^-$ layer that is an anode layer and an impurity concentration of the $n^+$ type layer that is a cathode layer is disclosed (see, for example, Patent Document 1).

Prior-Art Documents

Patent Documents

Patent Document 1: Japanese Patent No. 5309360

SUMMARY

Problems to be Solved by the Invention

In recent years, the trade-off between a forward voltage (Vf) and recovery loss has been improved by thinning semiconductor substrates of the PIN diodes used mainly as power semiconductor devices. However, forming the semiconductor substrates very thin may cause the PIN diodes to break down due to a very high modulation level in an ON state and partial concentration of carriers in a recovery operation. In other words, a problem with degradation in a safe operating area (SOA) occurs.

In addition, low recovery loss specifications, that is, high forward voltage (Vf) specifications through adjusting characteristics require lifetime control using, for example, electron beam irradiation.

The technique disclosed in this Description has been conceived to solve such problems, and relates to a semiconductor device that adjusts the modulation level to enable prevention of partial concentration of carriers in a recovery operation without requiring, for example, the electron beam irradiation.

Means to Solve the Problems

The semiconductor device according to an aspect of the technique disclosed in this Description includes: a semiconductor layer of a first conductivity type; a first impurity layer of the first conductivity type, the first impurity layer being partially diffused in an underside of the semiconductor layer and higher in impurity concentration than the semiconductor layer; and a plurality of second impurity layers of a second conductivity type, the second impurity layers being partially diffused in a surface of the semiconductor layer, wherein the first impurity layer is formed, in a plan view, between the second impurity layers and in a position that does not overlap the second impurity layers, and only the semiconductor layer exists between the second impurity layers in the surface of the semiconductor layer.

The semiconductor device according to another aspect of the technique disclosed in this Description includes: a semiconductor layer of a first conductivity type; a first impurity layer of the first conductivity type, the first impurity layer being partially diffused in an underside of the semiconductor layer and higher in impurity concentration than the semiconductor layer; and a plurality of second impurity layers of a second conductivity type, the second impurity layers being partially diffused in a surface of the semiconductor layer, wherein the first impurity layer is formed, in a plan view, between the second impurity layers and in a position that does not overlap the second impurity layers, only the semiconductor layer exists between the second impurity layers in the surface of the semiconductor layer, the first impurity layer is partially diffused only in a cell region in the underside of the semiconductor layer, the semiconductor device further includes: a third impurity layer of the second conductivity type, the third impurity layer being partially diffused in the underside of the semiconductor layer; and a fourth impurity layer of the first conductivity type, the fourth impurity layer being partially diffused in the underside of the semiconductor layer, the fourth impurity layer is lower in impurity concentration than the first impurity layer, the first impurity layer is partially diffused in the fourth impurity layer, and the third impurity layer is partially diffused in the fourth impurity layer.

Effects of the Invention

The semiconductor device according to an aspect of the technique disclosed in this Description includes: a semiconductor layer of a first conductivity type; a first impurity layer of the first conductivity type, the first impurity layer being partially diffused in an underside of the semiconductor layer and higher in impurity concentration than the semiconductor layer; and a plurality of second impurity layers of a second conductivity type, the second impurity layers being partially diffused in a surface of the semiconductor layer, wherein the first impurity layer is formed, in a plan view, between the second impurity layers and in a position that does not overlap the second impurity layers, and only the semiconductor layer exists between the second impurity layers in the surface of the semiconductor layer.

With such a structure, the second impurity layers in the surface of the semiconductor layer and the first impurity layer in the underside of the semiconductor layer are disposed in respective positions that do not overlap in a plan view. Thus, for example, adjusting a distance between the first impurity layer and each of the second impurity layers can prevent increase in the modulation level. Thus, partial concentration of carriers in a recovery operation can be prevented without requiring, for example, electron beam irradiation.

The semiconductor device according to another aspect of the technique disclosed in this Description includes: a semiconductor layer of a first conductivity type; a first impurity layer of the first conductivity type, the first impurity layer being partially diffused in an underside of the semiconductor layer and higher in impurity concentration than the semiconductor layer; and a plurality of second impurity layers of a second conductivity type, the second impurity layers being partially diffused in a surface of the semiconductor layer, wherein the first impurity layer is formed, in a plan view, between the second impurity layers and in a position that does not overlap the second impurity layers, only the semiconductor layer exists between the second impurity layers in the surface of the semiconductor layer, the first impurity layer is partially diffused only in a cell region in the underside of the semiconductor layer, the semiconductor device further includes: a third impurity layer of the second conductivity type, the third impurity layer being partially diffused in the underside of the semiconductor layer; and a fourth impurity layer of the first conductivity type, the fourth impurity layer being partially diffused in the underside of the semiconductor layer, the fourth impurity layer is lower in impurity concentration than the first impurity layer, the first impurity layer is partially diffused in the fourth impurity layer, and the third impurity layer is partially diffused in the fourth impurity layer.

With such a structure, the second impurity layers in the surface of the semiconductor layer and the first impurity layer in the underside of the semiconductor layer are disposed in respective positions that do not overlap in a plan view. Thus, for example, adjusting a distance between the first impurity layer and each of the second impurity layers can prevent increase in the modulation level. Thus, partial concentration of carriers in a recovery operation can be prevented without requiring, for example, electron beam irradiation. The fourth impurity layer stabilizes the breakdown voltage of the semiconductor device. Thus, the leakage current can be reduced.

The object, features, aspects and advantages of the technique disclosed in the Description will become more apparent from the following detailed description and the accompanying drawings.

DESCRIPTION OF EMBODIMENTS

Figure 1:
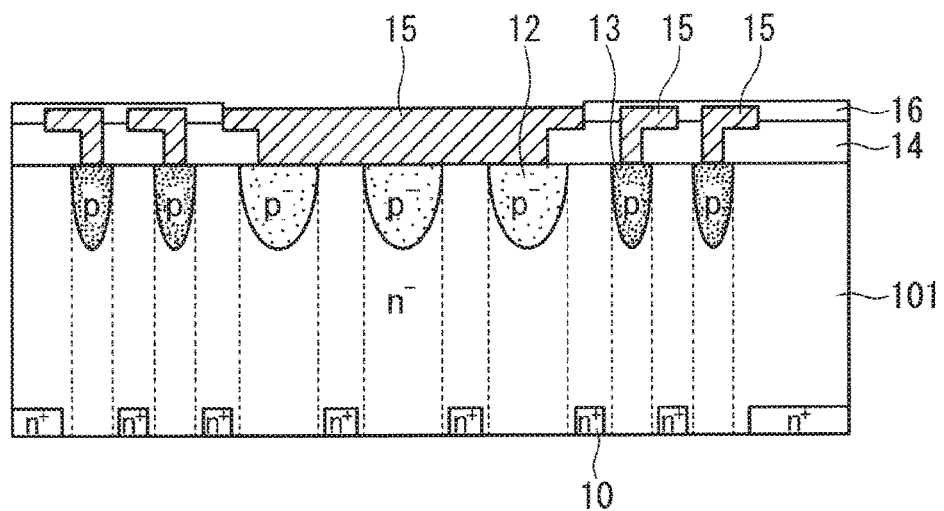
FIG. 1 is a cross-sectional view schematically exemplifying a structure for embodying a semiconductor device according to an embodiment.

Embodiments will be hereinafter described with reference to the attached drawings. The drawings are schematically illustrated, and the mutual relationships in size and position between images in the different drawings are not necessarily accurate but may be appropriately changed. In the following description, the same reference numerals are assigned to the same constituent elements, and their names and functions are the same. Thus, the detailed description thereof may be omitted.

In the following description, even when terms expressing a particular position and a particular direction such as "up", "down", "side", "bottom", "front", or "back" are used, these terms are used for convenience to facilitate the understanding of the details of Embodiments, and do not relate to the directions that are actually used.

In addition, the first conductivity type will be described as n-type, and the second conductivity type will be described as p-type.

Embodiment 1

A semiconductor device according to Embodiment 1 will be hereinafter described.

Figure 10:
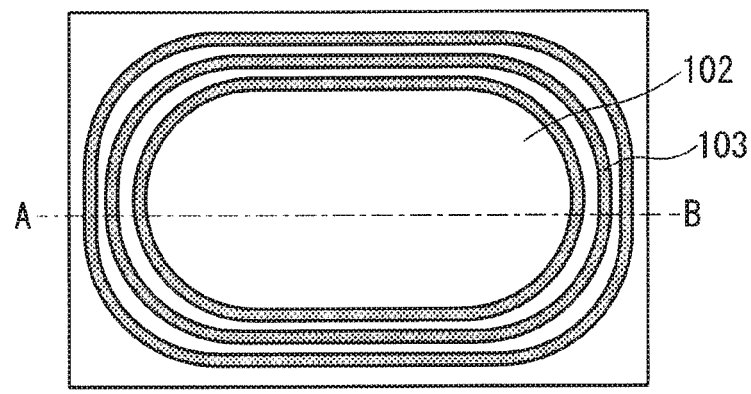
FIG. 10 is a cross-sectional view exemplifying a structure of a semiconductor device.
Figure 11:
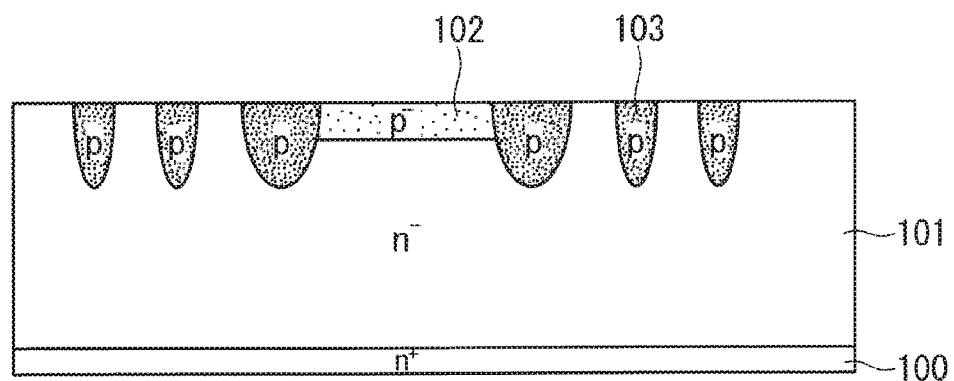
FIG. 11 is a cross-sectional view exemplifying a structure of a semiconductor device.

FIGS. 10 and 11 are cross-sectional views each exemplifying a structure of the semiconductor device. A PIN diode as an example of the semiconductor device will be hereinafter described.

As exemplified in FIGS. 10 and 11, the PIN diode includes an $n^+$ type layer 100 that is a cathode layer, an $n^-$ type layer 101 formed on the $n^+$ type layer 100, a $p^-$ type layer 102 that is partially formed in a surface layer of the $n^-$ type layer 101 and is an anode layer, and p type layers 103 formed in the surface layer of the $n^-$ type layer 101 to be spaced apart from each other and formed to enclose the $p^-$ type layer 102 in a plan view. The $n^+$ type layer 100 is formed in the entire underside of the $n^-$ type layer 101.

Figure 12:
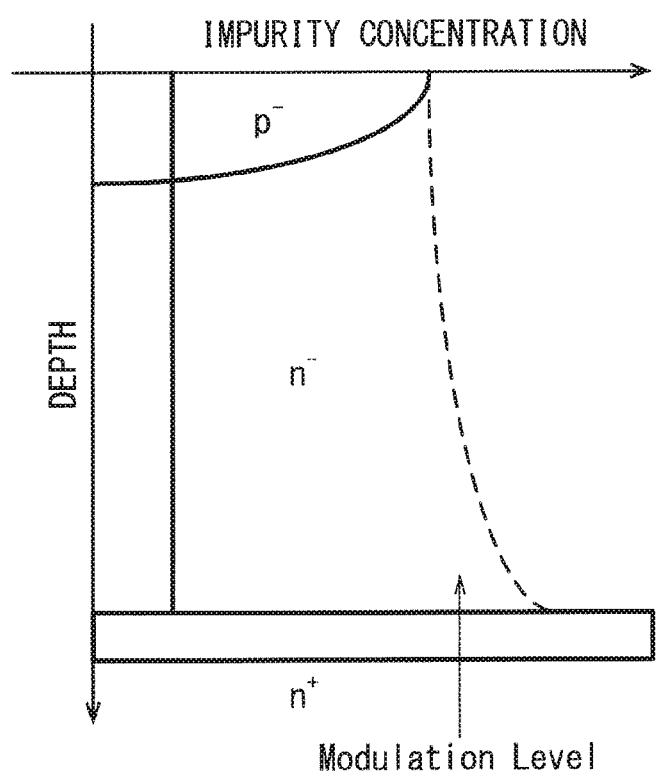
FIG. 12 is a diagram exemplifying an impurity concentration distribution of the PIN diode exemplified in FIGS. 10 and 11 in a depth direction.

FIG. 12 is a diagram exemplifying an impurity concentration distribution of the PIN diode exemplified in FIGS. 10 and 11 in a depth direction. In FIG. 12, the vertical axis represents the depth, and the horizontal axis represents the impurity concentration.

As exemplified in FIG. 12, the impurity concentration of the $n^+$ type layer 100 is almost constant from the underside of the $n^-$ type layer 101 to a predetermined depth. The impurity concentration of the $n^-$ type layer 101 is almost constant in the depth direction. The impurity concentration of the $p^-$ type layer 102 relatively sharply decreases from the surface of the $n^-$ type layer 101 toward the inside of the $n^-$ type layer 101.

With such a structure, the $p^-$ type layer 102 and the $n^+$ type layer 100 can increase the modulation level and achieve low ON-resistance (low Vf) as exemplified by the dotted line in FIG. 12. To adjust the modulation level, a structure for maintaining almost constant, in a depth direction, the impurity concentration of the $p^-$ type layer 102 that is an anode layer and the impurity concentration of the $n^+$ type layer 100 that is a cathode layer is disclosed (see, for example, Patent Document 1).

In recent years, the trade-off between the forward voltage (Vf) and recovery loss has been improved by thinning semiconductor substrates of the PIN diodes used mainly as power semiconductor devices. However, forming the semiconductor substrates very thin may cause the PIN diodes to break down due to a very high modulation level in an ON state and partial concentration of carriers in a recovery operation. In other words, a safe operating area (SOA) is degraded.

In addition, low recovery loss specifications, that is, high forward voltage (Vf) specifications through adjusting characteristics require lifetime control using, for example, electron beam irradiation.

[Structure]

FIG. 1 is a cross-sectional view schematically exemplifying a structure for embodying the semiconductor device according to Embodiment 1.

As exemplified in FIG. 1, a PIN diode includes the n⁻ type layer 101, n⁺ type layers 10 partially formed in an underside of the n⁻ type layer 101, p⁻ type layers 12 partially formed in a surface layer of the n⁻ type layer 101, p type layers 13 formed in the surface layer of the n⁻ type layer 101 to be spaced apart from each other and formed to enclose the p⁻ type layers 12 in a plan view, an oxide film 14 formed between the p⁻ type layers 12 and the p type layers 13 and between the p type layers 13 on the n⁻ type layer 101, electrodes 15 formed on the p⁻ type layers 12 and the p type layers 13, and a protective film 16 formed to cover the oxide film 14.

Here, the n⁺ type layers 10 and the p⁻ type layers 12 are formed in a cell region in respective positions that do not overlap in a plan view. The n⁺ type layers 10 and the p type layers 13 are also formed in a termination region in respective positions that do not overlap in a plan view. Specifically, the n⁺ type layers 10 are formed, in a plan view, between the p⁻ type layers 12, between the p type layers 13, or between the p⁻ type layers 12 and the p type layers 13 and in respective positions that overlap neither the p⁻ type layers 12 nor the p type layers 13.

Only the n⁻ type layer 101 exists, in the surface thereof, between the p⁻ type layers 12, between the p type layers 13, or between the p⁻ type layers 12 and the p type layers 13. The n⁺ type layers 10 are higher in impurity concentration than the n⁻ type layer 101.

[Manufacturing Method]

Next, a method for manufacturing the semiconductor device exemplified in FIG. 1 will be described.

First, the oxide film 14 is formed on the n⁻ type layer 101 that is a semiconductor substrate made of, for example, silicon (Si). The oxide film 14 has a thickness, for example, approximately ranging from 3000 Å to 10000 Å.

Next, after a pattern is formed through photolithography and etching, boron is doped on the exposed n⁻ type layer 101. A dose of boron, for example, approximately ranges from $1 \times 10^{13}$ [1/cm²] to $1 \times 10^{16}$ [1/cm²]. Then, the p type layers 13 that make up the termination region are formed by driving boron under approximately ranging from 900° C. to 1200° C. for approximately 30 to 120 minutes.

Next, after a pattern is formed through photolithography and etching, boron is doped on the exposed n⁻ type layer 101. A dose of boron, for example, approximately ranges from $1 \times 10^{12}$ [1/cm²] to $1 \times 10^{15}$ [1/cm²]. Then, the p⁻ type layers 12 that make up the cell region are formed by driving boron under approximately ranging from 900° C. to 1200° C. for approximately 30 to 120 minutes.

Next, the oxide film 14 approximately ranging from 5000 Å to 10000 Å is deposited thereon to pattern contact portions, and is etched. Then, aluminum is sputtered with a thickness approximately ranging from 1 μm to 8 μm. After a wire is patterned, the electrodes 15 are formed by etching.

Next, the protective film 16 is formed, and a portion of the protective film 16 corresponding to a wire connecting portion is removed. Here, a lower layer of the protective film 16 is a semi-insulating film (SInSiN film), and an upper layer thereof is an insulating film.

The semi-insulating film that is the lower layer has a thickness approximately ranging from 2000 Å to 10000 Å, and a refractive index approximately ranging from 2.2 to 2.7. The insulating film that is the upper layer has a thickness approximately ranging from 2000 Å to 10000 Å, and a refractive index approximately ranging from 1.8 to 2.2.

Then, the underside of the n⁻ type layer 101 that is the semiconductor substrate is polished to a desired thickness, and a pattern is formed through photolithography so as not to overlap the p⁻ type layers 12 and the p type layers 13 in the surface of the n– type layer 101.

Then, the n⁺ type layers 10 are formed by implanting ions and further by heat treatment (for example, laser annealing). In the implanting ions, for example, phosphorus or arsenic is doped with a dose approximately ranging from $1 \times 10^{13}$ [1/cm²] to $1 \times 10^{16}$ [1/cm²].

[Advantages]

With such a structure, the p⁻ type layers 12 in the surface of the n⁻ type layer 101 do not overlap the n⁺ type layers 10 in the underside of the n⁻ type layer 101 in a plan view. The p type layers 13 in the surface of the n⁻ type layer 101 do not overlap the n⁺ type layers 10 in the underside of the n⁻ type layer 101 in a plan view, either. Since increase in the modulation level can be prevented, the semiconductor device with low recovery loss specifications, that is, high forward voltage (Vf) specifications can be realized.

Embodiment 2

A semiconductor device according to Embodiment 2 will be described. Hereinafter, the same reference numerals will be assigned to the same structures described in Embodiment 1, and the detailed description thereof will be appropriately omitted.

[Structure]

Figure 2:
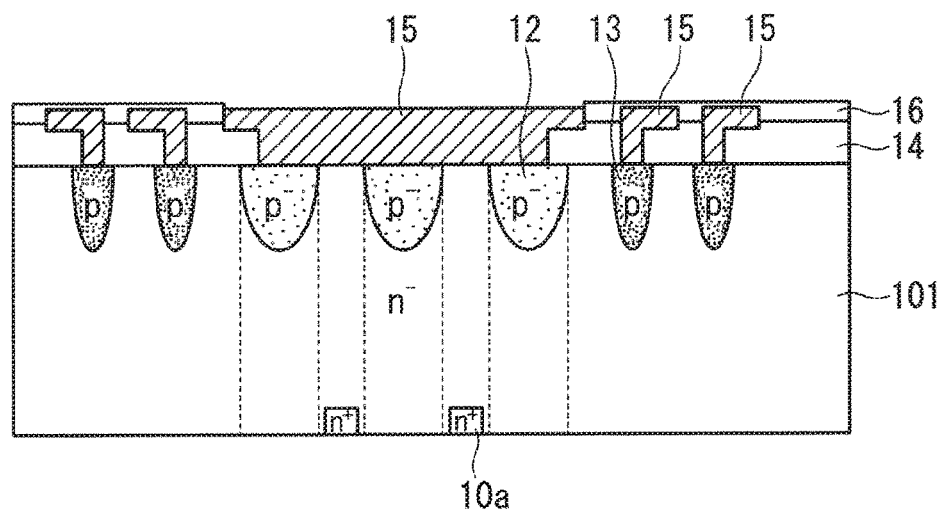
FIG. 2 is a cross-sectional view schematically exemplifying a structure for embodying a semiconductor device according to an embodiment.

FIG. 2 is a cross-sectional view schematically exemplifying a structure for embodying the semiconductor device according to Embodiment 2.

As exemplified in FIG. 2, a PIN diode includes the n⁻ type layer 101, n⁺ type layers 10a partially formed in the underside of the n⁻ type layer 101, the p⁻ type layers 12, the p type layers 13, the oxide film 14, the electrodes 15, and the protective film 16.

Here, the n⁺ type layers 10a are formed only in a portion of the underside of the n⁻ type layer 101 corresponding to the cell region. The n⁺ type layers 10a and the p⁻ type layers 12 are formed in respective positions that do not overlap in a plan view.

[Advantages]

With such a structure, the carrier level is suppressed in the termination region where the n⁺ type layers 10a are not formed. Thus, the SOA ruggedness in a recovery operation can be improved.

Embodiment 3

A semiconductor device according to Embodiment 3 will be described. Hereinafter, the same reference numerals will be assigned to the same structures described in Embodiments 1 and 2, and the detailed description thereof will be appropriately omitted.

[Structure]

Figure 3:
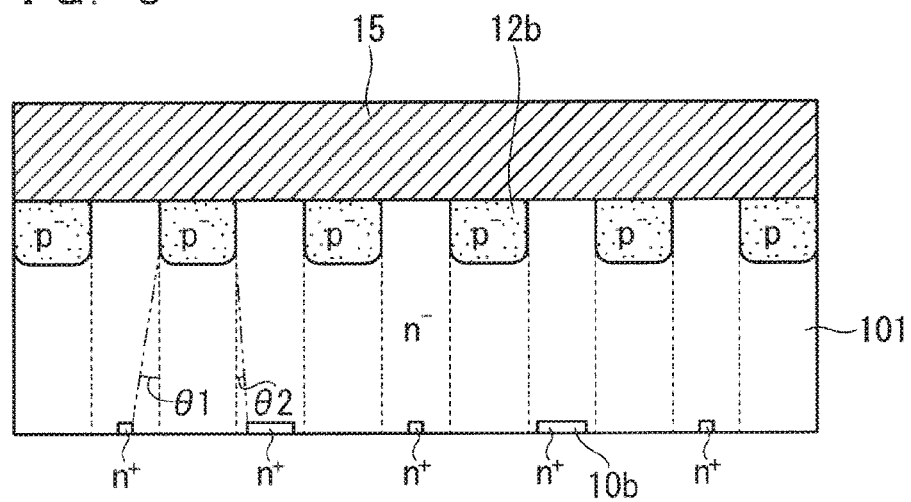
FIG. 3 is a cross-sectional view schematically exemplifying a structure for embodying a semiconductor device according to an embodiment.

FIG. 3 is a cross-sectional view schematically exemplifying a structure for embodying the semiconductor device according to Embodiment 3. FIG. 3 schematically exemplifies a structure particularly in a cell region.

As exemplified in FIG. 3, a PIN diode includes the n⁻ type layer 101, n⁺ type layers 10b partially formed in the underside of the n⁻ type layer 101, p⁻ type layers 12b partially formed in the surface layer of the n⁻ type layer 101, and the electrode 15.

Here, the n⁺ type layers 10b and the p⁻ type layers 12b are formed in respective positions that do not overlap in a plan view.

The distances each between the n⁺ type layer 10b and the p⁻ type layer 12b differ, depending on positions of the n⁺ type layers 10b at the ends and positions of the p⁻ type layers 12b at the ends in a plan view. Adjusting at least one of: positions where the n⁺ type layer 10b are to be formed in a plan view; widths of the n⁺ type layers 10b to be formed; positions where the p⁻ type layers 12b are to be formed in a plan view; and widths of the p⁻ type layers 12b to be formed enables the distances each between the n⁺ type layer 10b and the p⁻ type layer 12b to be controlled.

For example, adjusting all the widths of the n⁺ type layers 10b to be formed in such a manner that a viewing angle from the n⁺ type layer 10b to the corresponding p⁻ type layer 12b is equal to an angle θ1 or θ2 in the cross-sectional view exemplified in FIG. 3 enables the distances each between the n⁺ type layer 10b and the p⁻ type layer 12b to be constant.

Alternatively, the distances each between the n⁺ type layer 10b and the p⁻ type layer 12b may be controlled by, for example, adjusting the widths of part of the n⁺ type layers 10b to be formed in such a manner that the viewing angle from the n⁺ type layer 10b to the corresponding p⁻ type layer 12b is equal to the angle θ1 and adjusting the widths of the remaining n⁺ type layers 10b to be formed in such a manner that the viewing angle from the n⁺ type layer 10b to the corresponding p⁻ type layer 12b is equal to the angle θ2.

[Advantages]

With such a structure, the modulation level can be adjusted by controlling the distances each between the n⁺ type layer 10b and the p⁻ type layer 12b. The structure including a plurality of mixed patterns of the distances each between the n⁺ type layer 10b and the p⁻ type layer 12b also produces the same advantages obtained when elements having a plurality of characteristics are joined in parallel.

Since electric current does not flow in such a manner that the viewing angle from the n⁺ type layer 10b to the corresponding p⁻ type layer 12b is larger than or equal to 45 degrees, the angle at which the modulation level can be adjusted falls within 45 degrees. In other words, an interlayer distance that is the distance between the n⁺ type layer 10b and the p⁻ type layer 12b in a plan view is smaller than or equal to the thickness of the n⁻ type layer 101.

Embodiment 4

A semiconductor device according to Embodiment 4 will be described. Hereinafter, the same reference numerals will be assigned to the same structures described in Embodiments 1 to 3, and the detailed description thereof will be appropriately omitted.

[Structure]

Figure 4:
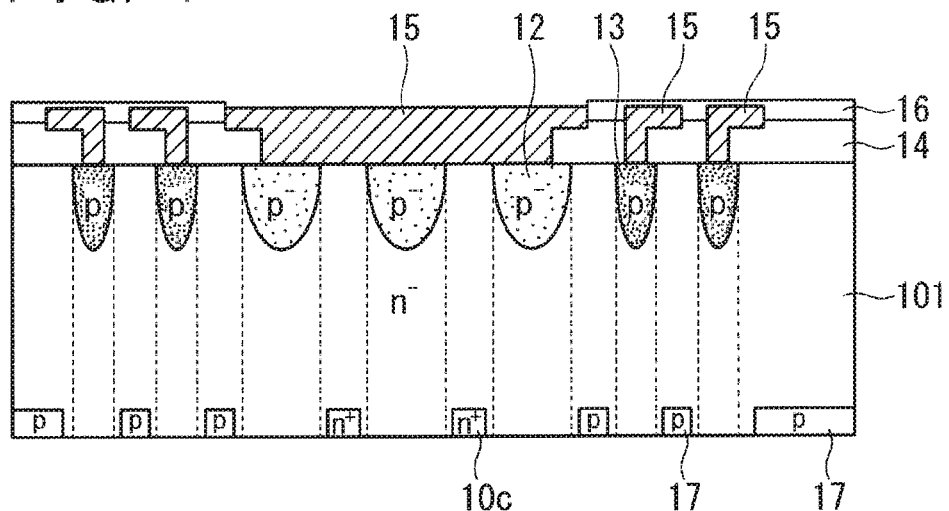
FIG. 4 is a cross-sectional view schematically exemplifying a structure for embodying a semiconductor device according to an embodiment.

FIG. 4 is a cross-sectional view schematically exemplifying a structure for embodying the semiconductor device according to Embodiment 4.

As exemplified in FIG. 4, a PIN diode includes the n⁻ type layer 101, n⁺ type layers 10c partially formed in the underside of the n⁻ type layer 101, the p⁻ type layers 12, the p type layers 13, the oxide film 14, the electrodes 15, the protective film 16, and p type layers 17 partially formed in the underside of the n⁻ type layer 101.

Here, the n⁺ type layers 10c are formed only in a portion of the underside of the n⁻ type layer 101 corresponding to the cell region. The p type layers 17 are formed only in a portion of the underside of the n⁻ type layer 101 corresponding to the termination region.

Here, the n⁺ type layers 10c and the p⁻ type layers 12 are formed in respective positions that do not overlap in a plan view. The p type layers 17 and the p type layers 13 are also formed in respective positions that do not overlap in a plan view.

[Advantages]

With such a structure, the carrier level is suppressed in the termination region where the n⁺ type layers 10c are not formed. Thus, the SOA ruggedness in a recovery operation can be improved.

Since the termination region for forming the p type layers 17 has a transistor structure, a bipolar operation during a recovery operation can reduce ringing (oscillation).

Embodiment 5

A semiconductor device according to Embodiment 5 will be described. Hereinafter, the same reference numerals will be assigned to the same structures described in Embodiments 1 to 4, and the detailed description thereof will be appropriately omitted.

[Structure]

Figure 5:
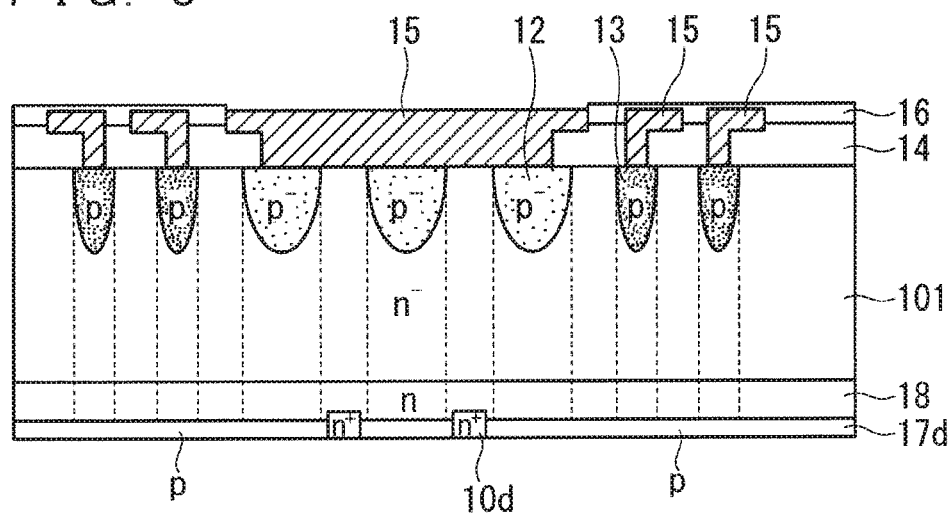
FIG. 5 is a cross-sectional view schematically exemplifying a structure for embodying a semiconductor device according to an embodiment.

FIG. 5 is a cross-sectional view schematically exemplifying a structure for embodying the semiconductor device according to Embodiment 5.

As exemplified in FIG. 5, a PIN diode includes the n⁻ type layer 101, a buffer layer 18 of n-type that is formed in the underside of the n⁻ type layer 101, n⁺ type layers 10d partially formed in the underside of the buffer layer 18, the p⁻ type layers 12, the p type layers 13, the electrodes 15, and a p type layer 17d partially formed in the underside of the buffer layer 18. The buffer layer 18 is lower in impurity concentration than the n⁺ type layers 10d.

Here, the n⁺ type layers 10d are formed only in a portion of the underside of the buffer layer 18 corresponding to the cell region. The p type layer 17d is formed only in a region except for the region where the n⁺ type layers 10d are formed in the underside of the buffer layer 18.

The n⁺ type layers 10d and the p⁻ type layers 12 are formed in respective positions that do not overlap in a plan view.

[Manufacturing Method]

Next, a method for manufacturing the semiconductor device exemplified in FIG. 5 will be described.

First, the oxide film 14, the p type layers 13 in the termination region, the p⁻ type layers 12 in the cell region, the electrodes 15, and the protective film 16 are formed, similarly as exemplified in Embodiment 1.

Then, the underside of the n⁻ type layer 101 that is the semiconductor substrate is polished to a desired thickness, and the buffer layer 18 of n-type is formed in the underside of the n⁻ type layer 101. Then, a pattern is forming through photolithography so as not to overlap the p⁻ type layers 12 in the surface of the n⁻ type layer 101.

Then, the n⁺ type layers 10d are formed by implanting ions and further by heat treatment (for example, laser annealing). The p type layer 17d is also formed.

[Advantages]

With such a structure, the breakdown voltage of the semiconductor device becomes stable and the leakage current can be reduced.

Embodiment 6

A semiconductor device according to Embodiment 6 will be described. Hereinafter, the same reference numerals will be assigned to the same structures described in Embodiments 1 to 5, and the detailed description thereof will be appropriately omitted.

[Structure]

Figure 6:
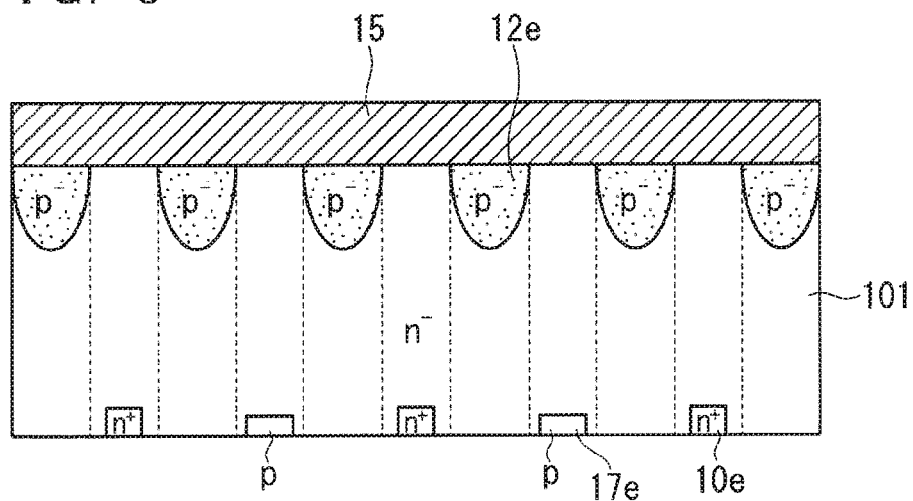
FIG. 6 is a cross-sectional view schematically exemplifying a structure for embodying a semiconductor device according to an embodiment.

FIG. 6 is a cross-sectional view schematically exemplifying a structure for embodying the semiconductor device according to Embodiment 6. FIG. 6 schematically exemplifies a structure particularly in a cell region.

As exemplified in FIG. 6, a PIN diode includes the n⁻ type layer 101, n⁺ type layers 10e partially formed in the underside of the n⁻ type layer 101, p⁻ type layers 12e partially formed in the surface layer of the n⁻ type layer 101, the electrode 15, and p type layers 17e partially diffused in the underside of the n⁻ type layer 101. The p type layers 17e are diffused in the cell region in the underside of the n⁻ type layer 101. The n⁺ type layers 10e and the p type layers 17e are formed to be spaced apart from each other in a plan view.

Here, the n⁺ type layers 10e and the p⁻ type layers 12e are formed in respective positions that do not overlap in a plan view. The p type layers 17e and the p⁻ type layers 12e are also formed in respective positions that do not overlap in a plan view. The p type layers 17e and n⁺ type layers 10e are also formed in respective positions that do not overlap in a plan view.

[Manufacturing Method]

Next, a method for manufacturing the semiconductor device exemplified in FIG. 6 will be described.

First, the p⁻ type layers 12e in the cell region and the electrode 15 are formed, similarly as exemplified in Embodiment 1.

Then, the underside of the n⁻ type layer 101 that is the semiconductor substrate is polished to a desired thickness, and a pattern is formed through photolithography so as not to overlap the p⁻ type layers 12e in the surface of the n⁻ type layer 101.

Then, the n⁺ type layers 10e are formed by implanting ions and further by heat treatment (for example, laser annealing). The p type layers 17e are also formed.

[Advantages]

Since the carrier density can be reduced with such a structure, a bipolar operation in the cell region during a recovery operation can reduce ringing (oscillation).

Figure 7:
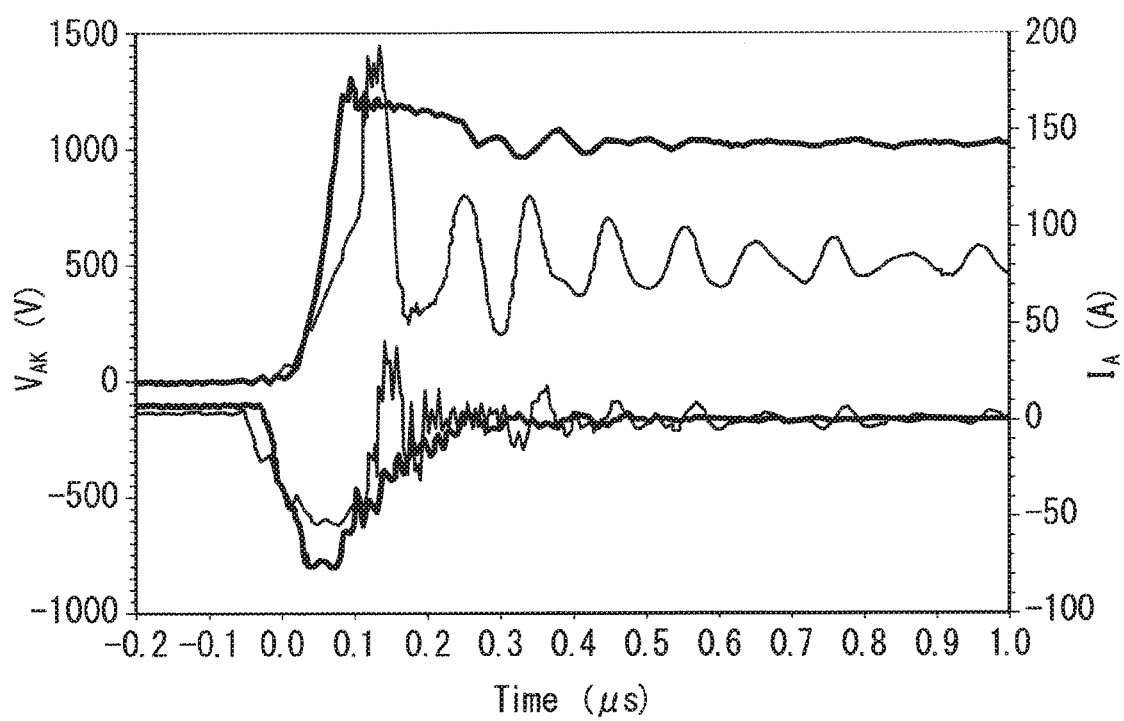
FIG. 7 is a diagram exemplifying waveforms in a recovery operation.

FIG. 7 is a diagram exemplifying waveforms in the recovery operation. In FIG. 7, the vertical axis to the left represents a voltage value [V], the vertical axis to the right represent a current value [A], and the horizontal axis represent a time [μs].

As exemplified in FIG. 7, it is clear that a bipolar operation (thick lines) can reduce ringing (oscillation) more than without the bipolar operation (thin lines).

Embodiment 7

A semiconductor device according to Embodiment 7 will be described. Hereinafter, the same reference numerals will be assigned to the same structures described in Embodiments 1 to 6, and the detailed description thereof will be appropriately omitted.

[Structure]

Figure 8:
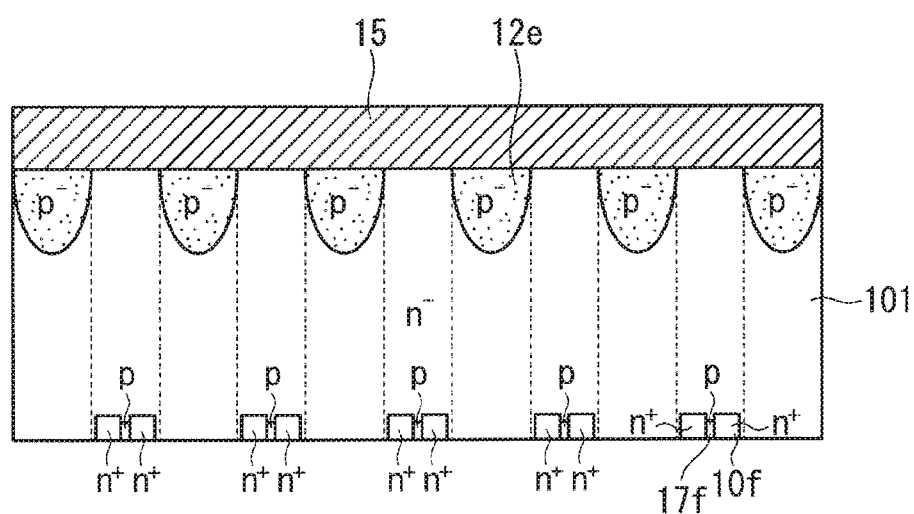
FIG. 8 is a cross-sectional view schematically exemplifying a structure for embodying a semiconductor device according to an embodiment.

FIG. 8 is a cross-sectional view schematically exemplifying a structure for embodying the semiconductor device according to Embodiment 7. FIG. 8 schematically exemplifies a structure particularly in a cell region.

As exemplified in FIG. 8, a PIN diode includes the n⁻ type layer 101, a plurality of n⁺ type layers 10f partially formed in the underside of the n⁻ type layer 101, the p⁻ type layers 12e, the electrode 15, and p type layers 17f partially formed in the underside of the n⁻ type layer 101.

Here, the n⁺ type layers 10f and the p⁻ type layers 12e are formed in respective positions that do not overlap in a plan view. The p type layers 17f and the p⁻ type layers 12e are also formed in respective positions that do not overlap in a plan view. The p type layers 17f are disposed to be sandwiched between the n⁺ type layers 10f in a plan view.

[Advantages]

Since layers having the same conductivity type can be separated in distance, the breakdown voltage can be stabilized.

Embodiment 8

A semiconductor device according to Embodiment 8 will be described. Hereinafter, the same reference numerals will be assigned to the same structures described in Embodiments 1 to 7, and the detailed description thereof will be appropriately omitted.

[Structure]

Figure 9:
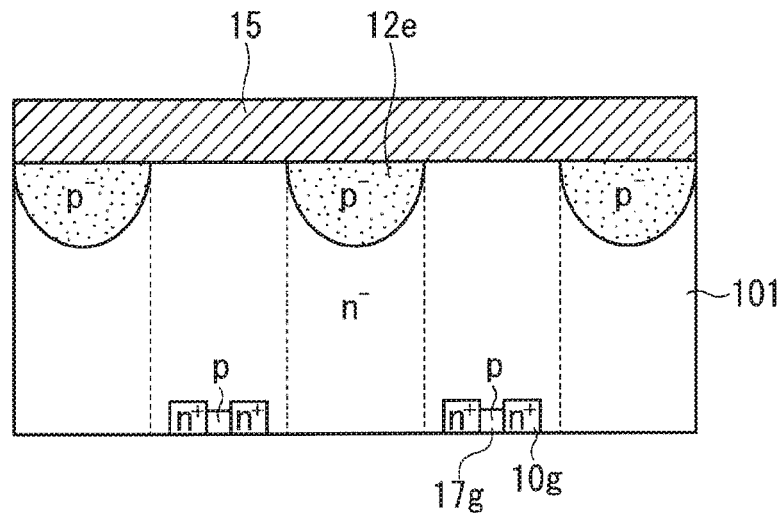
FIG. 9 is a cross-sectional view schematically exemplifying a structure for embodying a semiconductor device according to an embodiment.

FIG. 9 is a cross-sectional view schematically exemplifying a structure for embodying the semiconductor device according to Embodiment 8. FIG. 9 schematically exemplifies a structure particularly in a cell region.

As exemplified in FIG. 9, a PIN diode includes the n⁻ type layer 101, n⁺ type layers 10g partially formed in the underside of the n⁻ type layer 101, the p⁻ type layers 12e, the electrode 15, and p type layers 17g partially formed in the underside of the n⁻ type layer 101.

Here, the n⁺ type layers 10g and the p⁻ type layers 12e are formed in respective positions that do not overlap in a plan view. The p type layers 17g and the p⁻ type layers 12e are also formed in respective positions that do not overlap in a plan view. The p type layers 17g are disposed to be sandwiched between the n⁺ type layers 10g in a plan view. The n⁺ type layers 10g are formed deeper than the p type layers 17g from the underside of the n⁻ type layer 101.

[Advantages]

A depletion layer when reverse-biased can be prevented from extending with such a structure. Thus, increase in the leakage current can be prevented.

[Effects]

The following will exemplify the effects produced by Embodiments described above. The effects based on the specific structures exemplified in Embodiments will be described below. As long as the same effects are produced, the other specific structures exemplified in this Description may replace the specific structures below. The replacement may be performed across a plurality of Embodiments. In other words, the structures exemplified in different Embodiments may be combined and produce the same effects.

A semiconductor device according to Embodiments includes the n⁻ type layer 101 corresponding to a semiconductor layer of a first conductivity type (n-type), the n⁺ type layer 10 corresponding to a first impurity layer of the first conductivity type, and the p⁻ type layer 12 and further the p type layer 13 that correspond to a plurality of second impurity layers of a second conductivity type (p-type).

The n⁺ type layer 10 is partially diffused in an underside of the n⁻ type layer 101, and is higher in impurity concentration than the n⁻ type layer 101. The p⁻ type layer 12 and the p type layer 13 are partially diffused in a surface of the n⁻ type layer 101.

The n⁺ type layer 10 is formed, in a plan view, between the p⁻ type layers 12, between the p type layers 13, or between the p⁻ type layer 12 and the p type layer 13 and in a position that overlaps neither the p⁻ type layers 12 nor the p type layers 13.

Only the n⁻ type layer 101 exists between the p⁻ type layers 12, between the p type layers 13, or between the p⁻ type layer 12 and the p type layer 13, in the surface of the n⁻ type layer 101.

With such a structure, the p⁻ type layers 12 in the surface of the n⁻ type layer 101 and the n⁺ type layer 10 in the underside of the n⁻ type layer 101 are disposed in respective positions that do not overlap in a plan view. The p type layer 13 in the surface of the n⁻ type layer 101 and the n⁺ type layer 10 in the underside of the n⁻ type layer 101 are disposed in respective positions that do not overlap in a plan view. Thus, for example, adjusting a distance between the n⁺ type layer 10 and each of the p⁻ type layers 12 can prevent increase in the modulation level. Thus, partial concentration of carriers in a recovery operation can be prevented without requiring, for example, electron beam irradiation. In other words, the semiconductor device with low recovery loss specifications, that is, high forward voltage (Vf) specifications can be realized. The high-speed recovery operation (low EREC) can also be realized.

The structures exemplified in the Description and other than these structures can be appropriately omitted. In other words, only these structures can produce the effects. However, when at least one of the other structures exemplified in the Description is optionally added, that is, when another structure that is exemplified in the Description but is not described as the above structures is added to the above structures can also produce the same advantages above.

According to Embodiments above, the second impurity layers include: the p⁻ type layer 12 corresponding to a cell impurity layer partially diffused in a cell region; and the p type layers 13 corresponding to a plurality of terminal impurity layers.

The p type layers 13 are diffused in the surface of the n⁻ type layer 101 to be spaced apart from each other, and each of the p type layers 13 is formed in a termination region to enclose the p⁻ type layer 12 in a plan view, the termination region enclosing the cell region in a plan view.

Such a structure enables the breakdown voltage of the semiconductor device to be improved, using a guard ring structure in the termination region.

According to Embodiments above, the n⁺ type layer 10a corresponding to the first impurity layer is partially diffused only in the cell region in the underside of the n⁻ type layer 101.

With such a structure, the carrier level is suppressed in the termination region where the n⁺ type layer 10a is not formed. Thus, the SOA ruggedness in a recovery operation can be improved.

According to Embodiments above, the semiconductor device includes the p type layer 17 that corresponds to a third impurity layer of the second conductivity type and is partially diffused in the termination region in the underside of the n⁻ type layer 101.

Since the termination region for forming the p type layers 17 has a transistor structure with such a structure, the bipolar operation during a recovery operation can reduce ringing (oscillation).

According to Embodiments above, the p type layer 17e corresponding to the third impurity layer is partially diffused only in the cell region in the underside of the n⁻ type layer 101.

With such a structure, the breakdown voltage of the semiconductor device becomes stable and the leakage current can be reduced.

According to Embodiments above, the p type layer 17 is formed, in a plan view, between the p⁻ type layers 12, between the p type layers 13, or between the p⁻ type layer 12 and the p type layer 13 and in a position that overlaps neither the p⁻ type layers 12 nor the p type layers 13.

With such a structure, the p⁻ type layers 12 in the surface of the n⁻ type layer 101 and the n⁺ type layer 10c in the underside of the n⁻ type layer 101 are disposed in respective positions that do not overlap in a plan view. The p type layer 13 in the surface of the n⁻ type layer 101 and the n⁺ type layer 10c in the underside of the n⁻ type layer 101 are disposed in respective positions that do not overlap in a plan view. Thus, for example, adjusting a distance between the n⁺ type layer 10c and each of the p⁻ type layers 12 can prevent increase in the modulation level.

The semiconductor device according to Embodiments above includes the buffer layer 18 corresponding to a fourth impurity layer of the first conductivity type (n-type) and partially diffused in the underside of the n⁻ type layer 101.

The buffer layer 18 is lower in impurity concentration than the n⁺ type layer 10d corresponding to the first impurity layer. The n⁺ type layer 10d is partially diffused in the buffer layer 18. The p type layer 17d corresponding to the third impurity layer is partially diffused in the buffer layer 18.

With such a structure, the buffer layer 18 stabilizes the breakdown voltage of the semiconductor device. Thus, the leakage current can be reduced.

According to Embodiments above, the n⁺ type layer 10e corresponding to the first impurity layer and the p type layer 17e corresponding to the third impurity layer are formed to be spaced apart from each other in a plan view.

Since the carrier density can be reduced with such a structure, a bipolar operation in the cell region during a recovery operation can reduce ringing (oscillation). The high-speed recovery operation (low EREC) can also be realized.

According to Embodiments above, the semiconductor device includes the n⁺ type layers 10f corresponding to a plurality of the first impurity layers. The p type layer 17f corresponding to the third impurity layer is disposed to be sandwiched between the n⁺ type layers 10f in a plan view.

Since layers having the same conductivity type can be separated in distance with such a structure, the breakdown voltage can be stabilized.

According to Embodiments above, the n⁺ type layer 10g corresponding to the first impurity layer in the underside of the n⁻ type layer 101 is formed deeper than the p type layer 17g corresponding to the third impurity layer in the underside of the n⁻ type layer 101.

A depletion layer when reverse-biased can be prevented from extending with such a structure. Thus, increase in the leakage current can be prevented.

According to Embodiments above, an interlayer distance is smaller than or equal to a thickness of the n⁻ type layer 101, the interlayer distance being a distance between the n⁺ type layer 10b corresponding to the first impurity layer and each of the second impurity layers in a plan view.

With such a structure, adjusting a distance between the $n^+$ type layer 10 and each of the $p^-$ type layers 12 in a range where the interlayer distance is smaller than or equal to the thickness of the $n^-$ type layer 101 can prevent increase in the modulation level.

According to Embodiments above, a plurality of the interlayer distances include an interlayer distance different from other interlayer distances.

With such a structure, the modulation level can be adjusted by controlling the distances each between the $n^+$ type layer 10b and the $p^-$ type layer 12b. The structure including a plurality of mixed patterns of the distances each between the $n^+$ type layer 10b and the $p^-$ type layer 12b also produces the same advantages obtained when elements having a plurality of characteristics are joined in parallel.

According to Embodiments above, a semiconductor device includes: the $n^-$ type layer 101 corresponding to a semiconductor layer of a first conductivity type (n-type); the $n^+$ type layer 10d corresponding to a first impurity layer of the first conductivity type; the $p^-$ type layer 12 and further the p type layer 13 that correspond to a plurality of second impurity layers of a second conductivity type (p-type); the p type layer 17d corresponding to a third impurity layer of the second conductivity type; and the buffer layer 18 corresponding to a fourth impurity layer of the first conductivity type.

The $n^+$ type layer 10d is partially diffused in the underside of the $n^-$ type layer 101, and is higher in impurity concentration than the $n^-$ type layer 101. The p− type layer 12 and the p type layer 13 are partially diffused in a surface of the $n^-$ type layer 101.

The $n^+$ type layer 10d is formed, in a plan view, between the $p^-$ type layers 12, between the p type layers 13, or between the $p^-$ type layer 12 and the p type layer 13 and in a position that overlaps neither the $p^-$ type layers 12 nor the p type layers 13.

Only the $n^-$ type layer 101 exists between the $p^-$ type layers 12, between the p type layers 13, or between the $p^-$ type layer 12 and the p type layer 13, in the surface of the $n^-$ type layer 101. The $n^+$ type layer 10d is diffused in the cell region in the underside of the $n^-$ type layer 101.

The p type layer 17d is also diffused in the underside of the $n^-$ type layer 101. The buffer layer 18 is diffused in the underside of the $n^-$ type layer 101.

The buffer layer 18 is lower in impurity concentration than the $n^+$ type layer 10d. The $n^+$ type layer 10d is partially diffused in the buffer layer 18. The p type layer 17d is partially diffused in the buffer layer 18.

With such a structure, the $p^-$ type layers 12 in the surface of the $n^-$ type layer 101 and the $n^+$ type layer 10d in the underside of the $n^-$ type layer 101 are disposed in respective positions that do not overlap in a plan view. The p type layer 13 in the surface of the $n^-$ type layer 101 and the $n^+$ type layer 10d in the underside of the $n^-$ type layer 101 are disposed in respective positions that do not overlap in a plan view. Thus, for example, adjusting a distance between the $n^+$ type layer 10d and each of the $p^-$ type layers 12 can prevent increase in the modulation level. The buffer layer 18 stabilizes the breakdown voltage of the semiconductor device. Thus, the leakage current can be reduced.

[Modifications]

Although Embodiments may specify material properties, materials, dimensions, shapes, relative arrangement relationships, and conditions for implementation of each of the constituent elements, these are in all aspects illustrative and are not limited to those in the Description. Thus, numerous modifications that have yet been exemplified will be devised within the scope of the technique disclosed in the Description. Examples of the modifications include modifying, adding, or omitting at least one of the constituent elements, and further extracting at least one of the constituent elements in at least one of Embodiments and combining the extracted constituent element with a constituent element in the other Embodiments.

The constituent element described as one element in Embodiments above may be more than one unless it is contradictory. The respective constituent elements are conceptual units, and include one constituent element comprising a plurality of structures, one constituent element corresponding to a part of a structure, and a plurality of constituent elements included in one structure. Furthermore, each of the constituent elements includes a structure having another structure or shape as long as it performs the same function.

The explanation in the Description is referred to for all the objectives of the present technique, and is not regarded as prior art.

When Embodiments specify, for example, the name of a material without any particular designation, the material includes another additive, for example, an alloy unless it is contradictory.

Although the first conductivity type is described as n-type and the second conductivity type is described as p-type in Embodiments above, they may be vice versa.

EXPLANATION OF REFERENCE SIGNS 10, 10a, 10b, 10c, 10d, 10e, 10f, 10g, 100 $n^+$ type layer, 12, 12b, 12e, 102 $p^-$ type layer, 13, 17, 17d, 17e, 17f, 17g, 103 p type layer, 14 oxide film, 15 electrode, 16 protective film, 18 buffer layer, 101 $n^-$ type layer.

The invention claimed is:

1. A semiconductor device, comprising:
a semiconductor layer of a first conductivity type;
a first impurity layer of said first conductivity type, said first impurity layer being partially diffused in and positioned at an underside surface of said semiconductor layer and higher in impurity concentration than said semiconductor layer, said underside surface of said semiconductor layer constituting a bottommost semiconductor surface of said semiconductor device; and
a plurality of second impurity layers of a second conductivity type, said second impurity layers being partially diffused in an uppermost surface of said semiconductor layer,
wherein said first impurity layer is formed, in a plan view, between said second impurity layers and in a position that does not overlap said second impurity layers,
only said semiconductor layer exists between said second impurity layers in said uppermost surface of said semiconductor layer, and
all regions of said semiconductor layer that overlap said second impurity layers in said plan view have said first conductivity type and a concentration lower than said first impurity layer.

2. The semiconductor device according to claim 1, wherein said second impurity layers include:
a cell impurity layer partially diffused in a cell region; and
a plurality of terminal impurity layers diffused in said uppermost surface of said semiconductor layer to be spaced apart from each other, each of said terminal impurity layers being formed in a termination region to enclose said cell impurity layer in said plan view, said termination region enclosing said cell region in said plan view.

3. The semiconductor device according to claim 2, wherein said first impurity layer is partially diffused only in said cell region in said underside surface of said semiconductor layer.

4. The semiconductor device according to claim 2, further comprising
a third impurity layer of said second conductivity type, said third impurity layer being partially diffused in said termination region in said underside surface of said semiconductor layer.

5. The semiconductor device according to claim 4, wherein said third impurity layer is partially diffused in said cell region in said underside surface of said semiconductor layer.

6. The semiconductor device according to claim 5, further comprising
a fourth impurity layer of said first conductivity type, said fourth impurity layer being partially diffused in said underside surface of said semiconductor layer,
wherein said fourth impurity layer is lower in impurity concentration than said first impurity layer,
said first impurity layer is partially diffused in said fourth impurity layer, and
said third impurity layer is partially diffused in said fourth impurity layer.

7. The semiconductor device according to claim 4, wherein said first impurity layer and said third impurity layer are formed to be spaced apart from each other in said plan view.

8. The semiconductor device according to claim 4, comprising
a plurality of said first impurity layers,
wherein said third impurity layer is formed to be sandwiched between said plurality of said first impurity layers in said plan view.

9. The semiconductor device according to claim 4, wherein said first impurity layer in said underside surface of said semiconductor layer is formed deeper than said third impurity layer in said underside surface of said semiconductor layer.

10. The semiconductor device according to claim 1, wherein an interlayer distance is smaller than or equal to a thickness of said semiconductor layer, said interlayer distance being a distance between said first impurity layer and each of said second impurity layers in said plan view.

11. The semiconductor device according to claim 10, comprising
a plurality of said first impurity layers and said plurality of second impurity layers,
wherein a plurality of said interlayer distances include an interlayer distance different from other interlayer distances.

12. A semiconductor device comprising:
a semiconductor layer of a first conductivity type;
a first impurity layer of said first conductivity type, said first impurity layer being partially diffused in an underside of said semiconductor layer and higher in impurity concentration than said semiconductor layer; and
a plurality of second impurity layers of a second conductivity type, said second impurity layers being partially diffused in a surface of said semiconductor layer and including:
a cell impurity layer partially diffused in a cell region; and
a plurality of terminal impurity layers diffused in said surface of said semiconductor layer to be spaced apart from each other, each of said terminal impurity layers being formed in a termination region to enclose said cell impurity layer in a plan view, said termination region enclosing said cell region in said plan view; and
a third impurity layer of said second conductivity type, said third impurity layer being partially diffused in said termination region in said underside of said semiconductor layer, wherein
an entirety of said first impurity layer is formed, in said plan view, completely between said second impurity layers such that said first impurity layer does not overlap any part of said second impurity layers in said plan view,
only said semiconductor layer exists between said second impurity layers in said surface of said semiconductor layer, and
an entirety of said third impurity layer is formed, in said plan view, completely between said second impurity layers such that said third impurity layer does not overlap any part of said second impurity layers in said plan view.

13. A semiconductor device, comprising:
a semiconductor layer of a first conductivity type;
a first impurity layer of said first conductivity type, said first impurity layer being partially diffused in an underside surface of said semiconductor layer and higher in impurity concentration than said semiconductor layer, said first impurity layer being positioned at said surface of said underside of said semiconductor layer, and said underside surface of said semiconductor layer constituting a bottommost semiconductor surface of said semiconductor device; and
a plurality of second impurity layers of a second conductivity type, said second impurity layers being partially diffused in an uppermost surface of said semiconductor layer,
wherein said first impurity layer is formed, in a plan view, between said second impurity layers and in a position that does not overlap said second impurity layers,
only said semiconductor layer exists between said second impurity layers in said uppermost surface of said semiconductor layer,
said first impurity layer is partially diffused only in a cell region in said underside surface of said semiconductor layer,
said semiconductor device further comprises: a third impurity layer of said second conductivity type, said third impurity layer being partially diffused in said underside surface of said semiconductor layer; and
a fourth impurity layer of said first conductivity type, said fourth impurity layer being partially diffused in said underside surface of said semiconductor layer,
said fourth impurity layer is lower in impurity concentration than said first impurity layer,
said first impurity layer is partially diffused in said fourth impurity layer,
said third impurity layer is partially diffused in said fourth impurity layer, and
all regions of said semiconductor layer that overlap said second impurity layers in said plan view have an impurity concentration lower than the impurity concentration of said first impurity layer.

* * * * *